United States Patent
Wu

(10) Patent No.: US 8,554,355 B2
(45) Date of Patent: Oct. 8, 2013

(54) SYSTEM AND METHOD FOR CUTTING SUBSTRATE INTO WORKPIECES

(75) Inventor: Xiao-Bin Wu, Huai An (CN)

(73) Assignees: Hong Heng Sheng Electronical Technology (HuaiAn) Co., Ltd, Huaian (CN); Zhen Ding Technology Co., Ltd., Tayuan, Taoyuan (TW)

( * ) Notice: Subject to any disclaimer, the term of this patent is extended or adjusted under 35 U.S.C. 154(b) by 272 days.

(21) Appl. No.: 12/914,971

(22) Filed: Oct. 28, 2010

(65) Prior Publication Data

US 2011/0230997 A1    Sep. 22, 2011

(30) Foreign Application Priority Data

Mar. 22, 2010   (CN) .......................... 2010 1 0130088

(51) Int. Cl.
*G06F 19/00* (2011.01)
*H01L 21/00* (2006.01)
*H01L 21/30* (2006.01)
*B26D 7/08* (2006.01)
*B26D 7/06* (2006.01)

(52) U.S. Cl.
USPC ............... 700/134; 700/160; 438/33; 438/68; 438/458; 438/462; 83/22; 83/27

(58) Field of Classification Search
USPC ............. 700/134, 160, 192; 438/33, 68, 458, 438/460, 462; 83/22, 27
See application file for complete search history.

(56) References Cited

U.S. PATENT DOCUMENTS

| 6,014,965 A * | 1/2000 | Nishida ........................ 125/12 |
| 7,243,325 B2 | 7/2007 | McIntyre et al. |
| 7,565,002 B2 * | 7/2009 | Yasutomi et al. ............. 382/151 |
| 2001/0032533 A1 * | 10/2001 | Sekiya ............................ 83/452 |
| 2002/0054800 A1 * | 5/2002 | Hwu et al. .................... 409/116 |
| 2004/0091141 A1 * | 5/2004 | Hsu ............................... 382/141 |
| 2004/0092048 A1 * | 5/2004 | Hsu ................................ 438/17 |
| 2004/0112360 A1 * | 6/2004 | Boucher et al. ............ 125/16.01 |
| 2006/0027886 A1 * | 2/2006 | Liu ............................... 257/414 |
| 2006/0031801 A1 * | 2/2006 | McIntyre et al. ................. 716/8 |
| 2008/0003559 A1 * | 1/2008 | Toyama et al. ............... 434/350 |
| 2008/0125885 A1 * | 5/2008 | McNutt et al. .................. 700/81 |
| 2009/0298264 A1 * | 12/2009 | Arai et al. .................... 438/464 |
| 2010/0055877 A1 * | 3/2010 | Kajiyama et al. ............ 438/464 |
| 2010/0289889 A1 * | 11/2010 | Cheng et al. .................... 348/95 |

FOREIGN PATENT DOCUMENTS

| JP | 6120334 A | | 4/1994 |
| JP | 06120334 A | * | 4/1994 |
| JP | 2007216683 A | | 8/2007 |
| TW | 179278 | | 2/1992 |
| TW | 200512060 A | | 4/2005 |
| TW | 200904287 A | | 1/2009 |

OTHER PUBLICATIONS

JP machine translation based on JP 06120334, Apr. 28, 1994.*

* cited by examiner

*Primary Examiner* — Kavita Padmanabhan
*Assistant Examiner* — Darrin Dunn
(74) *Attorney, Agent, or Firm* — Altis & Wispro Law Group, Inc.

(57) ABSTRACT

A computer obtains user input from an input to control a cutter and a conveyor to cut a substrate. The control module of the computer calculates a total number of cuts of the substrate and a distance that the substrate moves before each cut of the substrate according to user input. A conveyer control module of the computer controls the conveyer to move the substrate, where a reminder signal is sent out after the substrate has moved the distance. A cutter control module of the computer controls the cutter to cut the substrate.

10 Claims, 7 Drawing Sheets

SYSTEM AND METHOD FOR CUTTING SUBSTRATE INTO WORKPIECES

BACKGROUND

1. Technical Field

The present disclosure generally relates to cutting technology, and particularly, to a system and a method for controlling a cutter and a conveyer to cut a substrate into a number of workpieces.

2. Description of Related Art

Printed circuit boards (PCBs) are manufactured using Copper Clad Laminates (CCLs). During the manufacturing of the PCBs, the first step is to cut a CCL into a number of workpieces, with each CCL having a size corresponding to a specific size of a PCB.

Generally, the CCL is cut by a cutting apparatus, which is operated by a user. The cutting apparatus includes a cutter and a feeder. When the feeder pushes the CCL a predetermined distance to a predefined cutting position, the user operates the cutter to cut the CCL. However, the user cannot know exactly when the CCL is located in the predefined cutting position. If the user operates the cutter to cut the CCL before the CCL it is located at the predefined cutting position, then the CCL is cut wrong and the cut workpiece does not qualify to be a PCB. If the user operates the cutter slowly, after the CCL has been located in the predefined cutting position, time is wasted and the efficiency of manufacturing the PCBs is affected. In addition, the CCL is generally rectangular, and needs to be cut first along the length and second along the width. Sometimes the user gets confused about number of cuts along one side or the other, therefore the substrate can easily be cut wrong.

What is needed, therefore, is a system and a method for cutting a substrate into a number of individual workpieces, that overcomes the aforementioned problem.

BRIEF DESCRIPTION OF THE DRAWINGS

Many aspects of the present embodiment may be better understood with reference to the following drawings. The components in the drawings are not necessarily drawn to scale, the emphasis instead being placed upon clearly illustrating the principles of the present apparatus. Moreover, in the drawings, all the views are schematic, and like reference numerals designate corresponding parts throughout the several views.

DETAILED DESCRIPTION

The application is illustrated by way of examples and not by way of limitation in the figures of the accompanying drawings in which like references indicate similar elements.

In general, the word "module" as used hereinafter, refers to logic embodied in hardware or firmware, or to a collection of software instructions, written in a programming language, for example, Java. One or more software instructions in the modules may be embedded in firmware. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
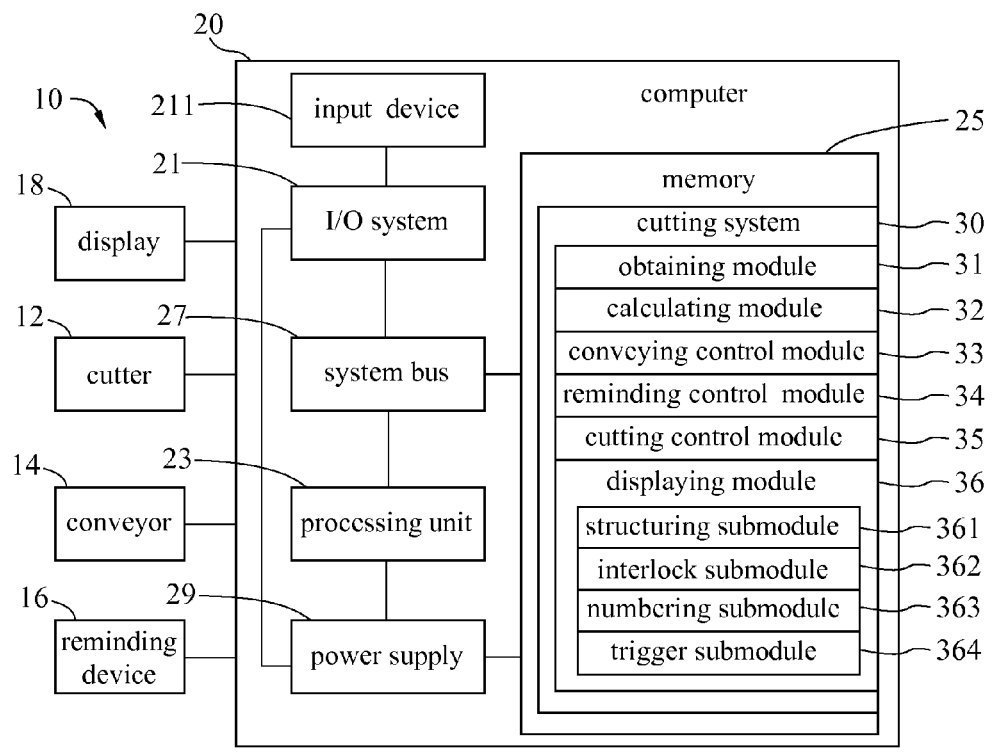
FIG. 1 is a block diagram illustrating an apparatus, in accordance with an exemplary embodiment.

FIG. 1 is a block diagram of one embodiment of an apparatus 10, which is operable to cut a substrate into a number of individual workpieces by a user. The apparatus 10 may include a cutter 12, a conveyer 14, a reminder device 16, a display 18, and a computer 20.

The computer 20 electronically communicates with the cutter 12, the conveyer 14, the reminder device 16, and the display 18. The cutter 12 moves along a vertical direction to cut a substrate. The conveyer 14 may be a number of juxtaposed rollers, or a motor driven belt, or other mechanically driven bulk material handling device. The conveyer 14 conveys the substrate along a horizontal direction to a predefined distance. The reminder device 16 can alert the user to the status of the apparatus 10, and can be in the form of a reminder signal, such as buzzer, or a caution light, for example. The display 18 shows the output information of the computer 20.

The computer 20 includes an I/O system 21, a processing unit 23, a memory 25, a system bus 27, and a power supply 29. The system bus 27 is used to electronically communicate the I/O system 21, the processing unit 21, the memory 25, and the power supply 29 with each other, and generally includes a data bus, an address bus, a control bus, and a power bus. The data bus is used for transferring data between the I/O system 21, the processing unit 23, and the memory 25. The address bus specifies the memory locations (addresses) for the data transfers. When the processing unit 23 needs to read or write to a memory location, it specifies that memory location on the address bus, wherein the value to be read or written is sent on the data bus. The control bus is used to provide control information communication. The power bus is electrically connected with the power supply 29. Thus, the power supply 29 supplies power to the I/O system 21, the processing unit 23, and the memory 25 with the power bus.

Figure 2:
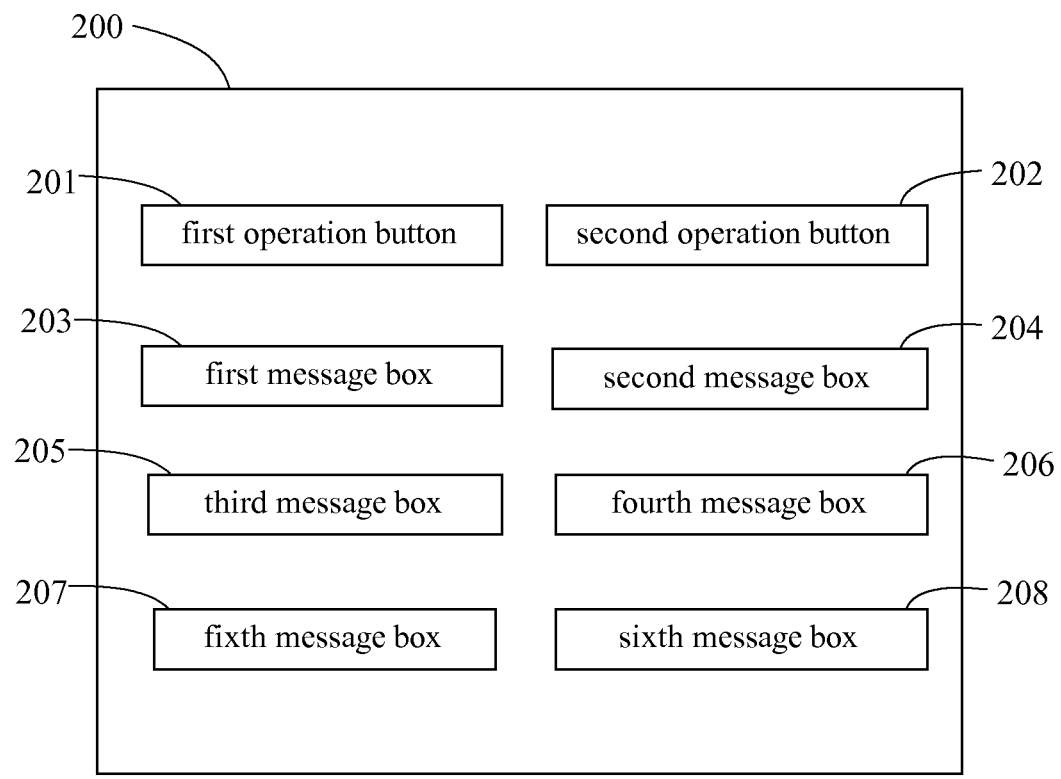
FIG. 2 is a schematic diagram illustrating an example of a user interface of the apparatus of FIG. 1.

The I/O system 21 provides both an input interface and an output interface between the cutting apparatus 10 and the user. In the present embodiment, a user interface 200 communicates with the input interface and the output interface is shown on the display 18, as shown in FIG. 2. That is, the display 18 functions as an output device, used to show output information of the I/O system 21. An input device 211 communicates with the I/O system 21. Thus, the user can operate the input device 211 to input information and commands into the computer 20. In other embodiments, the display 18 can be a touch screen, and function as an input/output device.

The memory 25 has a number of function modules (or sets of instructions) stored therein. The processing unit 23 of the computer 20 executes the function modules (or sets of instructions) stored in the memory 25. In one example, one or more computerized codes of a cutting system 30 can be embodied in the memory 25, and can be executed by the processing unit 23 to cut a substrate into a number of individual workpieces. The cutting system 30 includes an obtaining module 31, a calculating module 32, a conveyer control module 33, a reminder control module 34, a cutter control module 35, and a output module 36 stored in the memory 25.

The obtaining module 31 obtains and stores the input information from the input device 211. The input information includes the size of the substrate and the size of the workpiece. In the present embodiment, the substrate is substantially rectangular in cross section, and has a first side substantially parallel to the lengthwise direction thereof and a second side substantially parallel to the widthwise direction thereof. The size of the substrate means the length and the width of the substrate, and the size of the workpiece means the length and the width of the workpiece. In other embodiments, the size of the substrate may just mean the length of the substrate or just mean the width of the substrate, and the size of the workpiece may just mean the length of the workpiece or just mean the width of the workpiece.

The calculating module 32 is configured to calculate cutting parameters according to user input. In the present embodiment, cutting parameters include a total number of cuts to the substrate on the first side, a total number of cuts to the substrate on the second side, a first distance that the substrate moves along the length before each cut on the first side, and a second distance that the substrate moves along the width before each cut on the second side. In other embodiments, cutting parameters may just include a total number of cuts to the substrate on the first side and a distance that the substrate moves along the length before each cut on the first side.

The conveyer control module 33 is configured for controlling the conveyer 14 to move the substrate the first distance or the second distance. The reminder control module 34 is capable of controlling the reminder device 16 to send out a reminder signal after the substrate is moved the first distance or the second distance. The cutter control module 35 is capable of controlling the cutter 12 to cut the substrate. The output module 36 controls the information on the user interface 200 shown on the display 18.

Specifically, the output module 36 includes a structuring submodule 361, an interlock submodule 362, a numbering submodule 363, and a trigger submodule 364. The structuring submodule 361 constructs the user interface 200. In the present embodiment, the user interface 200 has a first operation button 201, a second operation button 202, a first message box 203, a second message box 204, a third message box 205, a fourth message box 206, a fifth message box 207, and a sixth message box 208 shown thereon, as shown in FIG. 2. The first and the second operation buttons 201 and 202 can be clicked by a user using the input device 211 thereby triggering the cutter control module 35. In other words, the first operation button 201 is used to be clicked and then to send a first cutting command to the cutter control module 35, thus that the cutter control module 35 controls the cutter 12 to cut the substrate on the first side. Similarly, when the second operation button 202 is clicked, the cutter control module 35 is triggered by a second cutting command thereby controlling the cutter 12 to cut the substrate on the second side. The first and the second message boxes 203 and 204 display user input. In particular, the first message box 203 displays the size of the substrate, and the second message box 204 displays the size of the workpiece. The third and the fourth message boxes 205 and 206 display the cutting parameters of the calculating module 32. In detail, the third message box 205 displays the total number of cuts to the substrate on the first side and the first distance, and the fourth message box 206 displays the total number of cuts to the substrate on the second side and the second distance. The fifth message box 207 displays the number of times the user clicks of the first operation button 201. The sixth message box 208 displays the number of times the user clicks of the second operation button 202.

The interlock submodule 362 controls the two operation buttons 201 and 202 shown on the user interface 200 to interlock with each other. That is, the interlock submodule 362 interlocks the first and the second cutting command. Therefore, the operation buttons 201 and 202 are never locked at the same time and never unlocked at the same time. The numbering submodule 363 calculates the number of times the user clicks the first and the second operation buttons 201 and 202. In other words, the numbering submodule 363 calculates the total number of the first cutting commands and the total number of the second cutting commands. Thus, the fifth message box 207 can display the number of times the user clicks the first operation button 201, and the sixth message box 208 can display the number of times the user clicks the second operation button 202. When the trigger submodule 364 detects that the number of times the user clicks the first operation button 201 equals to the total number of cuts to the substrate on the first side, the trigger submodule 364 triggers the interlock submodule 362 to lock the first operation button 201 and to unlock the second operation button 202. When the trigger submodule 364 detects that the number of times the user clicks the second operation button 202 equals to the total number of cuts to the substrate on the second side, the trigger submodule 364 triggers the interlock submodule 362 to lock the second operation button 202 and to unlock the first operation button 201.

The user interface 200 may be other suitable structures, for example, it can just include one operation button. Accordingly, the output module 36 may be other suitable structures, for example, a structure without the interlock submodule 362.

It should be appreciated that the cutting apparatus 10 is only one exemplary embodiment, and that the apparatus 10 may have more or fewer components than shown, or a different configuration of components. The various components shown in FIG. 1 may be implemented in hardware, software or a combination of both, hardware and software, including one or more signal processors and/or application specific integrated circuits.

Figure 3:
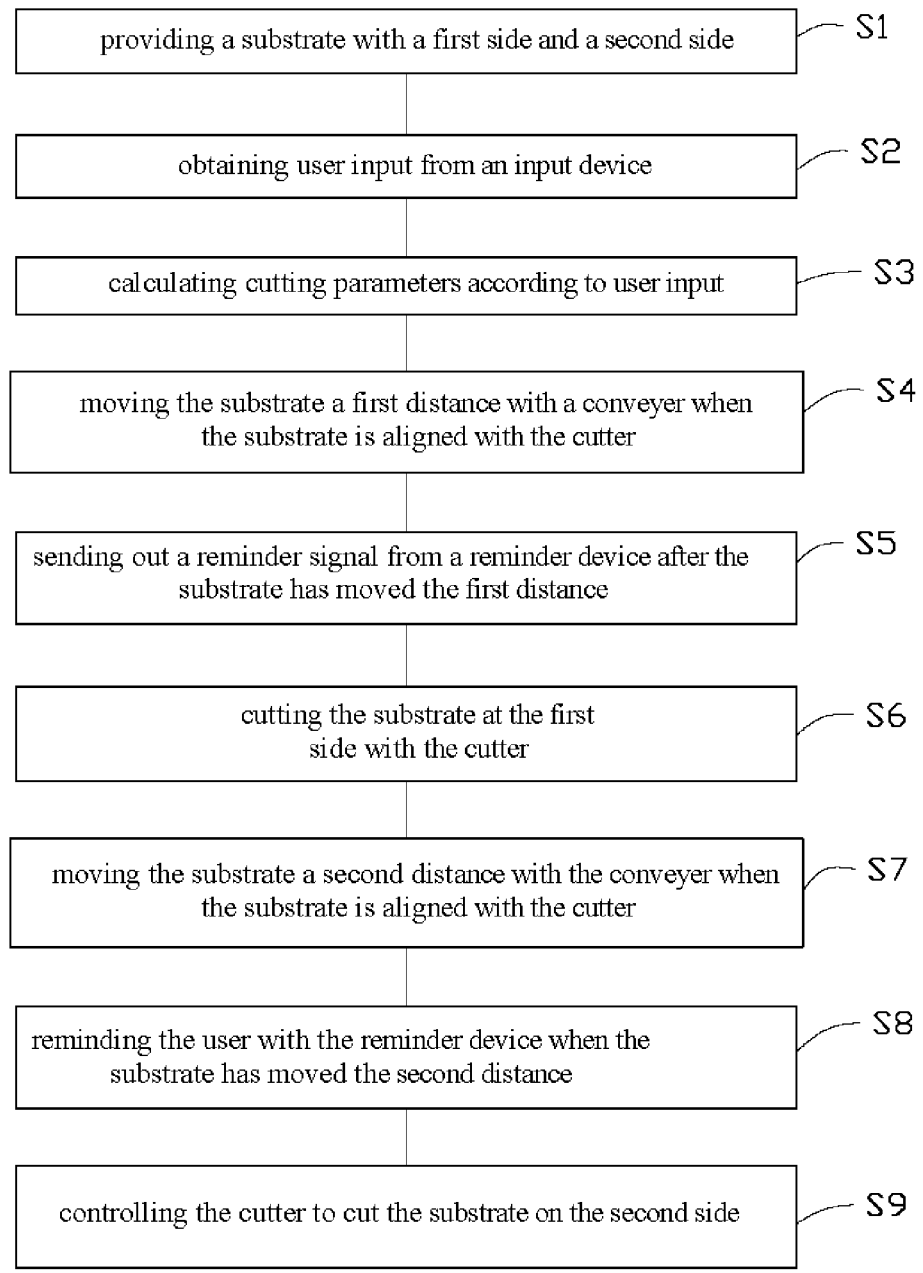
FIG. 3 is a flow diagram illustrating a process for cutting a substrate into a number of individual workpieces using the apparatus of FIG. 1.

FIG. 3 is a flowchart of one embodiment of a method for cutting a substrate into a number of individual workpieces using the apparatus 10 of FIG. 1. Depending on the embodiment, additional blocks may be added, others removed, and the ordering of the blocks may be changed.

Figure 4:
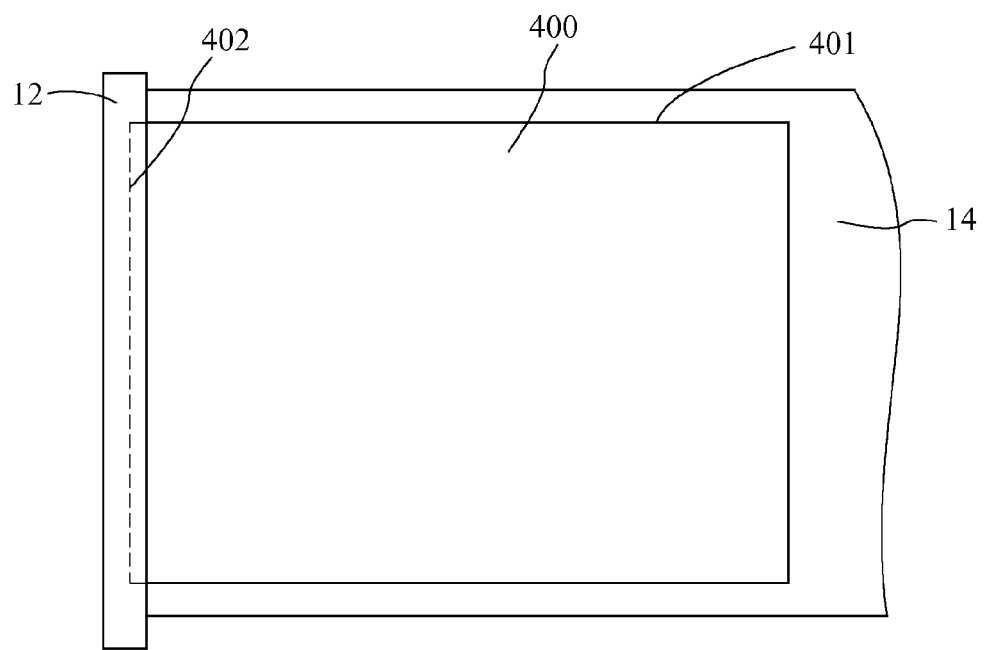
FIG. 4 is a schematic diagram illustrating a substrate positioned on the apparatus.

In block S1, referring to FIG. 4, a substrate 400 is provided. The substrate 400 is rectangular, and has a first side 401 and a second side 402 substantially perpendicular to the first side 401.

In block S2, the obtaining module 31 obtains user input from the I/O system 22 when a user inputs the size of the substrate and the size of the workpiece with the input device 211. In the present embodiment, the user can input a length and a width of the substrate 400, a length and a width of the workpiece. In this step, the size of the substrate 400 is shown in the first message box 203 of the user interface 200, and the size of the workpiece is shown in the second message box 204 of the user interface 200.

In block S3, the calculating module 32 performs the calculation of cutting parameters according to user input. The cutting parameters include a total number of cuts to the substrate 400 on the first side 401, a total number of cuts to the substrate 400 on the second side 402, a first distance that the substrate 400 moves along the length before each cut to the first side 401, and a second distance that the substrate 400 moves along the width before each cut to the second side 402. The total number of cuts to the substrate 400 on the first side 401 and the first distance are shown in the third message box 205, the total number of cuts to the substrate 400 on the second side 402 and the second distance are shown in the fourth message box 206.

In block S4, the conveyer control module 33 controls the conveyer 14 to move the substrate 400 when the substrate 400 is positioned on the conveyer 14 and the second side 402 is aligned with a blade of the cutter 12. The substrate 400 is moved the first distance.

In block S5, the reminder control module 34 controls the reminder device 16 to send out a reminder signal to remind the user after the substrate 400 has moved the first distance.

In block S6, the cutter control module 35 controls the cutter 12 to cut the substrate 400 on the first side 401 according to a first cutting command when the user clicks the first operation button 201 using the input device 211. Then, the numbering submodule 363 detects the number of times the user clicks the first operation button 201, and the number is shown in the fifth message box 207.

Figure 5:
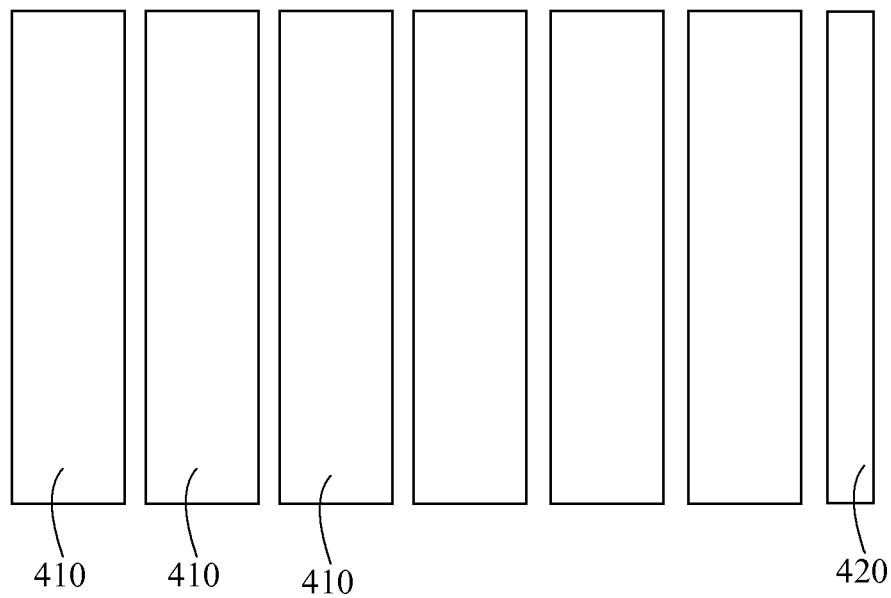
FIG. 5 is a schematic diagram illustrating the substrate of FIG. 4 being cut into a number of individual preforms.

In the present embodiment, the substrate 400 is conveyed and cut until the number of times the user clicks the first operation button 201 is equal to the total number of cuts to the substrate 400 on the first side 401. Then the trigger submodule 364 triggers the interlock submodule 362 to lock the first operation button 201 and unlock the second operation button 202. The substrate 400 is cut into a number of individual preforms 410 and a first waste plate 420, which is not the right size to qualify to be a PCB, as shown in FIG. 5.

Figure 6:
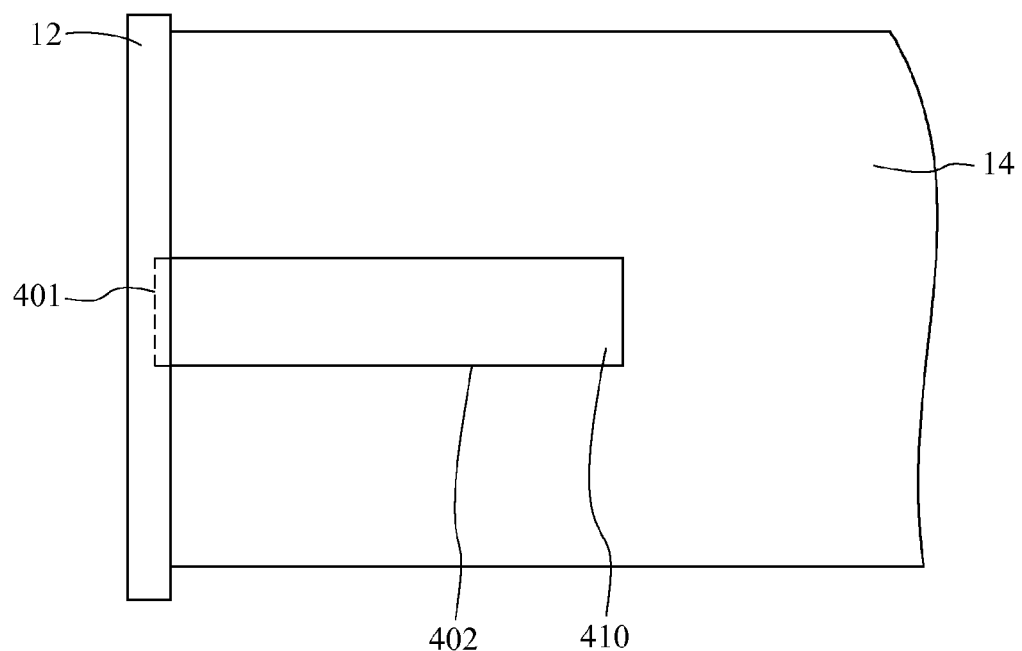
FIG. 6 is a schematic diagram illustrating the preform of FIG. 5 positioned on the apparatus.

In block S7, referring to FIG. 6, the conveyer control module 33 controls the conveyer 14 to move the preform 410 when the preform 410 is positioned on the conveyer 14 and the first side 401 is aligned with the blade of the cutter 12. The preform 410 is moved the second distance.

In block S8, the reminder control module 34 controls the reminder device 16 to send out a reminder signal to remind the user after the preform 410 has moved the second distance.

In block S9, the cutter control module 35 controls the cutter 12 to cut the preform 410 on the second side 402 according to a second cutting command when the user clicks the second operation button 202 using the input device 211. Then, the numbering submodule 363 detects the number of times the user clicks the second operation button 202, and the number is shown in the sixth message box 208.

Figure 7:
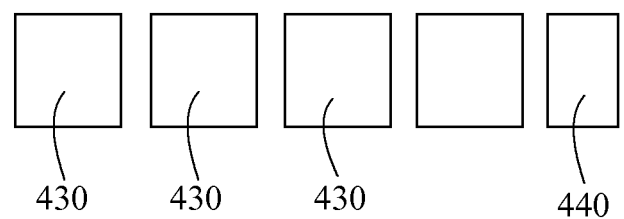
FIG. 7 is a schematic diagram illustrating the preform of FIG. 5 being cut into a number of individual workpieces.

In the present embodiment, the preform 410 is moved and cut until the number of times the user clicks the second operation button 202 is equal to the total number of cuts to the substrate on the second side 402. Then the trigger submodule 364 triggers the interlock submodule 362 to lock the second operation button 202 and unlock the first operation button 201. The preform 410 is cut into a number of individual workpieces 430 and a second waste plate 440, which is not the right size to qualify to be a PCB, as shown in FIG. 7. It is noted that each preform 410 is cut into a number of workpieces 430 according to the above steps of S7 to S9.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

The invention claimed is:

1. A computing system for controlling a cutter to cut a substrate into a plurality of individual workpieces, the substrate having a first side and a second side substantially perpendicular to the first side, the system comprising:
    an obtaining module operable to obtain user input from an input device, wherein the user input includes a size of the substrate and a size of the workpiece;
    a calculating module operable to calculate cutting parameters according to user input, wherein cutting parameters includes a total number of cuts to the substrate on the first side, a total number of cuts to the substrate on the second side, a first distance that the substrate moves before each cut on the first side, and a second travel distance that the substrate moves before each cut on the second side;
    a conveyer control module operable to control a conveyer to move the substrate the first distance or the second distance;
    a reminder control module operable to control a reminder device to send out a reminder signal after the substrate moving the first distance or the second distance;
    a cutter control module communicating with both of the cutter and the input device, the cutter control module operable to control the cutter to cut the substrate on the first side when a first cutting command is inputted from the input device after the substrate moving the first distance, the cutter control module further operable to control the cutter to cut the substrate on the second side when a second cutting command is inputted from the input device; and
    an interlock module operable to interlock the first cutting command and the second cutting command from the inputting device.

2. The system of claim 1, wherein the cutter control module is operable to control the cutter to move along a first direction to cut the substrate, and the conveyer control module is operable to control the conveyer to move the substrate along a second direction, which is perpendicular to the first direction.

3. The system of claim 1, further comprising an output module, which is operable to send the total number of cuts of the substrate and the distance to a display.

4. The system of claim 3, further comprising a numbering module, which is operable to calculate the total number of the first cutting command and the total number of the second cutting command, the outputting module further operable to send the total number of the first cutting command and the total number of the second cutting command to the display.

5. The system of claim 4, further comprising a trigger module communicating with the numbering module, the trigger module operable to trigger the interlock module to lock the first cutting command and unlock the second cutting command when the total number of the first cutting command is equal to the total number of cuts to the substrate on the first side, and operable to trigger the interlock module to unlock the first cutting command and lock the second cutting command when the total number of the second cutting command is equal to the total number of cuts to the substrate on the second side.

6. The method of claim 1, wherein a sound signal is sent out from the reminder device to remind the user.

7. The method of claim 1, wherein a light signal is sent out from the reminder device to remind the user.

8. A computer-implemented method of controlling a cutter to cut a substrate into a plurality of individual workpieces, the method comprising:
    providing a substrate having a first side and a second side substantially perpendicular to the first side;

obtaining user input from an input device, wherein the user input including a size of the substrate and a size of a workpiece;

calculating cutting parameters according to user input, cutting parameters including a total number of cuts to the substrate on the first side, a total number of cuts to the substrate on the second side, a first distance that the substrate moves before each cut on the first side, and a second distance that the substrate moves before each cut on the second side;

moving the substrate the first distance with a conveyor when the second side of the substrate is aligned with the cutter;

sending out a reminder signal from a reminder device after the substrate has moved the first distance to reminding a user;

cutting the substrate on the first side with the cutter;

moving the substrate the second distance with the conveyer when the first side of the substrate is aligned with the cutter;

reminding the user with the reminder device when the substrate has moved the second distance; and controlling the cutter to cut the substrate on the second side, wherein the user controls the cutter via a user interface, the user interface has a first operation button and a second operation button shown thereon, the first operation button and the second operation button interlock with each other, the first operation button being operable to control the cutter to cut the substrate on the first side, the second operation button being operable to control the cutter to cut the substrate on the second side.

9. The method of claim 8, wherein a sound signal is sent out from the reminder device to remind the user.

10. The method of claim 8, wherein a light signal is sent out from the reminder device to remind the user.

* * * * *